United States Patent
Wei

(10) Patent No.: US 7,329,578 B2
(45) Date of Patent: Feb. 12, 2008

(54) METHOD OF FORMING FLOATING-GATE TIP FOR SPLIT-GATE FLASH MEMORY PROCESS

(75) Inventor: Chun-Huan Wei, Dongshi Town, Taichung County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 151 days.

(21) Appl. No.: 11/156,393

(22) Filed: Jun. 20, 2005

(65) Prior Publication Data

US 2006/0286738 A1 Dec. 21, 2006

(51) Int. Cl.
*H01L 21/336* (2006.01)
*H01L 21/3205* (2006.01)
*H01L 21/4763* (2006.01)

(52) U.S. Cl. ............ 438/257; 438/593; 257/315; 257/317; 257/E21.422; 257/E21.179

(58) Field of Classification Search ........... 438/201, 438/211, 257, 593; 257/314, 315, 317, 321, 257/320, 239, 261, E29.3, E29.129, E21.179, 257/E21.422, E21.68, E21.687, E21.688
See application file for complete search history.

(56) References Cited

U.S. PATENT DOCUMENTS

| | | | |
|---|---|---|---|
| 5,801,415 A * | 9/1998 | Lee et al. .......... | 257/316 |
| 6,090,668 A | 7/2000 | Lin et al. .......... | 438/266 |
| 6,242,308 B1 | 6/2001 | Hsieh et al. ....... | 438/265 |
| 6,410,957 B1 | 6/2002 | Hsieh et al. ....... | 257/321 |
| 6,441,429 B1 * | 8/2002 | Hsieh et al. ....... | 257/316 |
| 6,448,605 B1 * | 9/2002 | Chang .............. | 257/314 |
| 6,486,508 B1 * | 11/2002 | Lee ................. | 257/316 |
| 6,528,844 B1 * | 3/2003 | Hopper et al. ...... | 257/316 |
| 6,753,223 B2 * | 6/2004 | Lin ................. | 438/257 |
| 6,825,523 B2 * | 11/2004 | Caprara et al. ..... | 257/314 |
| 6,953,966 B2 * | 10/2005 | Nagata ............. | 257/321 |

* cited by examiner

*Primary Examiner*—Evan Pert
*Assistant Examiner*—Victor A. Mandala, Jr.
(74) *Attorney, Agent, or Firm*—Thomas, Kayden, Horstemeyer & Risley

(57) ABSTRACT

A split-gate flash memory process for improving sharpness and height of a floating-gate tip has steps as follows. Using a dry etching process, a trench is formed in the first polysilicon layer through the pattern opening. An oxide layer is then deposited on the first polysilicon layer through a CVD process to fill the trench. Through a CMP process, portions of the oxide layer are removed to substantially planarize the trench-filled oxide layer as the first polysilicon layer. Using a dry etching process with the trench-filled oxide layer with a mask, the first polysilicon layer is patterned as a floating gate, and the corner edge of the floating gate has a polysilicon tip.

14 Claims, 3 Drawing Sheets

METHOD OF FORMING FLOATING-GATE TIP FOR SPLIT-GATE FLASH MEMORY PROCESS

FIELD OF THE INVENTION

The present invention relates to split-gate flash memory devices, and particularly to a method of forming a floating-gate tip of a split-gate flash memory device while improving the sharpness and height of the floating-gate tip.

BACKGROUND OF THE INVENTION

Memory devices for non-volatile storage of information include read only memory (ROM), programmable read only memory (PROM), erasable programmable read only memory (EPROM), electrically erasable programmable read only memory (EEPROM) and flash EEPROM. EEPROM devices have the advantage of electrical programming and erasing, achieved by charging and discharging actions controlled by the control gate. The actions also affect the conductivity of the channel between source and drain. One advantage of flash memory is its capacity for block-by-block memory erasure. The speed of memory erasure is fast, and normally takes just 1~2 seconds for the complete removal of a whole block of memory. Another advantage of flash memory is low electric consumptions. The voltages of a control gate, a source, and a drain are adjusted to program or erase in a split-gate flash memory.

The performance of EEPROM devices is enhanced by providing a protrusion for the floating gate of the split-gate memory cell. Normally, the protrusion is formed by poly oxidation, that is, by thermally oxidizing the polysilicon layer of which the floating gate comprises. The polyoxide portion of the polysilicon floating gate is used as a hard mask to form a protrusion, so-called gate bird's beak, which in turn enhances Fowler-Nordheim (F—N) tunneling for the programming and erasing of an EEPROM cell. FIGS. 1A to 1C are cross-sectional diagrams illustrating a conventional split-gate flash memory process. In FIG. 1A, a gate oxide layer 12 is thermally grown over a silicon substrate 10, and a first polysilicon layer 14 is then formed thereon followed by the deposition of a silicon nitride layer 16. Next, a photoresist layer 18 is provided on the silicon nitride layer 16 and has a pattern corresponding to areas where a floating gate will be defined, and then the floating gate pattern is etched into the silicon nitride layer 16, thus forming an opening 19 where the underlying first polysilicon layer 14 is exposed. After removing the photoresist layer 18, as shown in FIG. 1B, the exposed portion of the first polysilicon layer 14 is oxidized to form a polyoxide layer 20. In FIG. 1C, the silicon nitride layer 16 is subsequently removed from the first polysilicon layer 14, and then the polyoxide layer 20 serves as a hard mask to remove the first polysilicon layer 14 except the portion 14a that is covered by the polyoxide layer 20.

As well known in the art, the step of patterning the floating ate 14a is usually accomplished by main etch followed by over-etch, and therefore the corner edge 15 is usually rounded off, which is not desirable for achieving fast program erase speed. For the traditional method employing a local oxidation of silicon (LOCOS) process to form a LOCOS polyoxide, the sharpness of the floating-gate tip is no longer satisfactory, and it becomes more difficult to control the "bird's beak" length which impacts the height and angle of the poly tip. The poor shape of the poly tip considerably reduces yield and reliability. Several methods of improving the corner edge of the floating gate are disclosed in the prior art. U.S. Pat. No. 6,242,308 to Hsieh et al incorporated herein by reference, describes a method of forming poly tip to improve erasing and programming speed split gate flash. U.S. Pat. No. 6,090,668 to Hsieh et al incorporated herein by reference, describes a method of using a top-oxide as a hard mask to form floating gate. U.S. Pat. No. 6,410,957 to Hsieh et al incorporated herein by reference, describes a method of forming poly tips by smiling effect mechanism. None of the cited prior art teaches a simple process approach to improve the sharpness and height of the floating-gate tip for enhanced Fowler-Nordheim (F—N) tunneling.

SUMMARY OF THE INVENTION

It is an object of the present invention to provide a method of improving the sharpness and height of a floating-gate tip in a split-gate flash memory process.

It is another object of the present invention to provide a method using a trench etching process, an oxide deposition process and a poly etching process to control the tip angle, and using a chemical mechanical polishing process to maintain the tip height.

It is another object of the present invention to provide a method of improving the sharpness and height of a floating-gate tip without using a silicon nitride deposition process over a polysilicon layer.

To achieve the above objectives, the present invention provides a flash memory process comprising: forming a gate dielectric layer overlying a semiconductor substrate; forming a first polysilicon layer overlying said gate dielectric layer; forming a photoresist layer overlying said first polysilicon layer, wherein said photoresist layer has a pattern opening corresponding to an area where a floating gate will be defined; removing at least part of said first polysilicon layer through said pattern opening to form a trench in said first polysilicon layer without exposing said gate dielectric layer; removing said photoresist layer; forming an oxide layer overlying said first polysilicon layer to fill said trench; partially removing said oxide layer till said oxide layer remaining in said trench is substantially leveled off with said first polysilicon layer; and removing portions of said first polysilicon layer not covered by said oxide layer remaining in said trench, and thereby said first polysilicon layer covered by said oxide layer functioning as a floating gate with a polysilicon tip.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION OF THE PREFERRED EMBODIMENTS

Figure 1A:
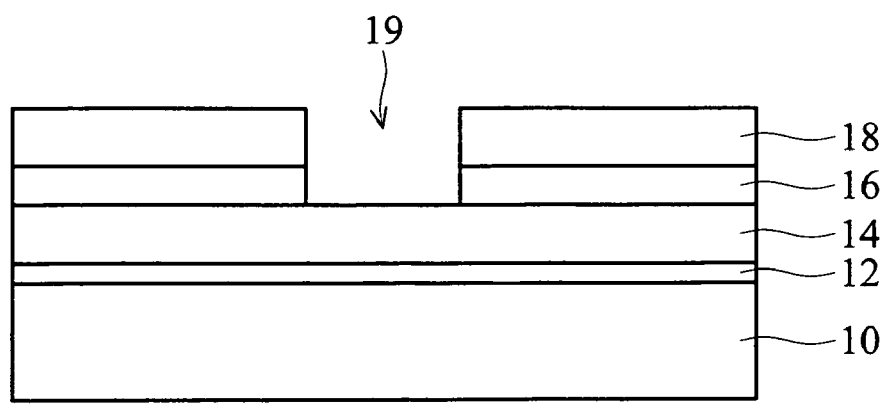
FIGS. 1A to 1C are cross-sectional diagrams illustrating a conventional split-gate flash memory process.
Figure 1B:
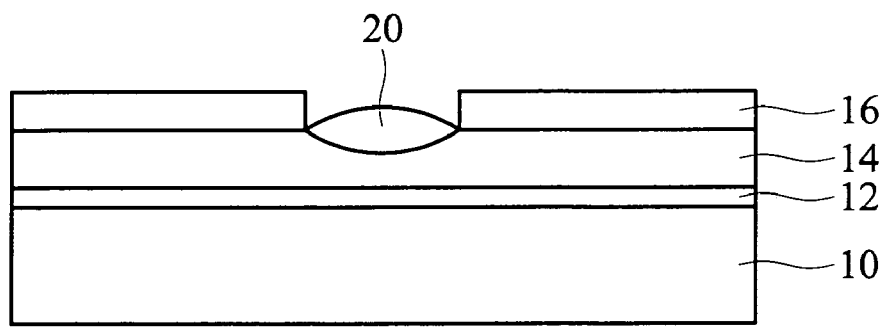
Figure 1C:
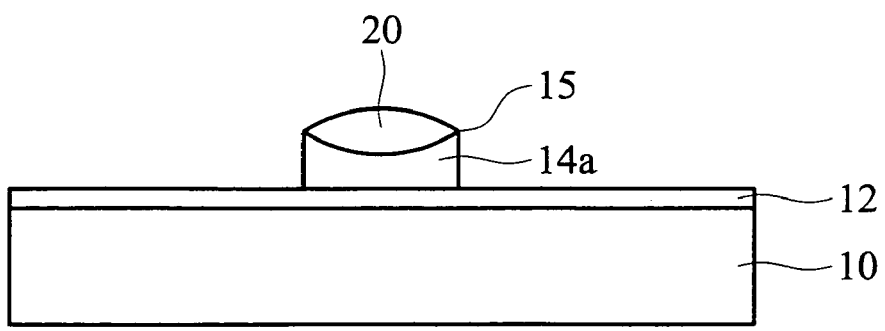

The present invention provides a method of forming a floating-gate tip in split-gate flash memory process, which overcomes the aforementioned problems of the prior art through the use of LOCOS polyoxide. Particularly, instead of the conventional LOCOS polyoxide, the present invention uses a trench etching process, an oxide deposition process and a gate etching process to control the tip angle, and uses a chemical mechanical polishing (CMP) process to maintain the tip height, thus the sharpness and height of the floating-gate tip can be improved such that charge transfer between substrate and floating gate, and then the charge transfer between the floating gate and control gate, is fast. Moreover, the present invention omits a deposition process of a silicon nitride layer over the floating-gate poly layer prior to the trench etching process, thus saving one furnace process cost and simplifying the split-gate flash memory process.

Hereinafter, reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented.

In an exemplary embodiment of the present invention, a method of forming a floating-gate tip of a split-gate flash memory device will be illustrated in cross-sectional diagrams of FIGS. 2A to 2F.

Figure 2A:
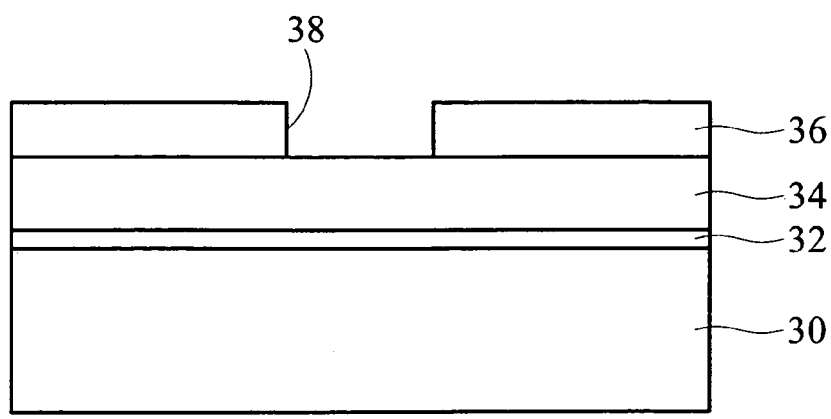
FIGS. 2A to 2F are cross-sectional diagrams illustrating a method of forming a floating-gate tip of a split-gate flash memory device according to the present invention.

In FIG. 2A, a semiconductor substrate 30 is provided with an active device region for a split-gate flash memory device. The semiconductor substrate 30 includes, but is not limited to, silicon, silicon on insulator (SOI), SiGe on insulator, or combinations thereof. A gate dielectric layer 32, a first gate conductive layer 34 and a photoresist layer 36 are successively deposited over the semiconductor substrate 30. The gate dielectric layer 32 may be a silicon oxide layer with a thickness between about 5 to about 150 Angstroms, for example, formed through a thermal oxidation process or a chemical vapor deposition (CVD) process. It is to be appreciated other well-known gate dielectric layers such as oxides, nitrides, and combination thereof may be utilized if desired. The thickness of the gate dielectric layer 32 is chosen specifically for the scaling requirements of the split-gate flash memory device technology. The first gate conductive layer 34 may be a polysilicon layer with a thickness between about 800 Angstroms to about 2000 Angstroms, which is be deposited through methods including, but are not limited to, Low Pressure CVD (LPCVD) methods, CVD methods and Physical Vapor Deposition (PVD) sputtering methods employing suitable silicon source materials. If desired the polysilicon layer can be ion implanted to the desired conductivity type. It is to be appreciated other well-known gate conductive materials such as metal, single crystalline silicon, or any combinations thereof may be utilized if desired. The photoresist layer 36 is spun over the first gate conductive layer 34 through conventional techniques, and has a pattern opening 38 corresponding to areas where floating gates are to be defined.

Figure 2B:
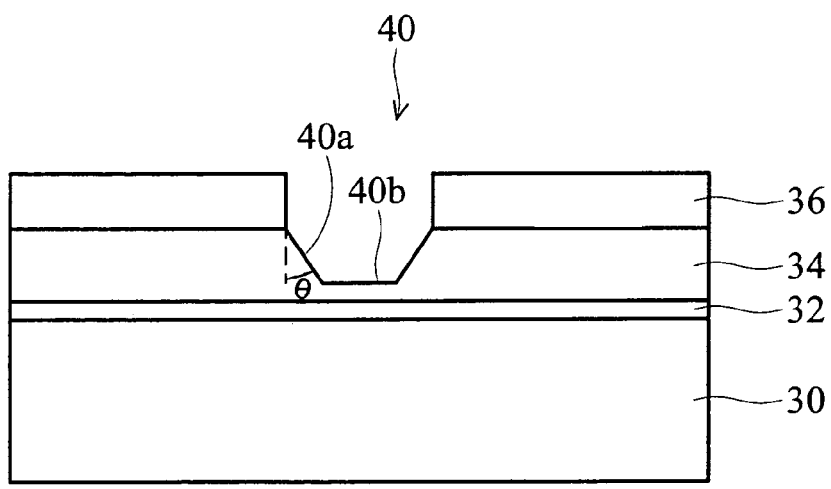

In FIG. 2B, using a dry etching process with the photoresist layer 36 as a mask, the first polysilicon layer 34 underlying the pattern opening 38 is removed to reach a predetermined thickness, thus forming a trench 40 in the area where a floating gate is to be defined. The trench 40 has sidewalls 40a and a bottom 40b. Preferably, the sidewall 40a has a sloped profile with a 0~90 degree angle ($\theta$) from the vertical, and the bottom 40b does not expose the gate dielectric layer 32. It is noted that a silicon nitride deposition employed in the conventional floating gate process is omitted between the first gate conductive layer 34 and the photoresist layer 36. This can simplify process steps and save one furnace cost.

Figure 2C:
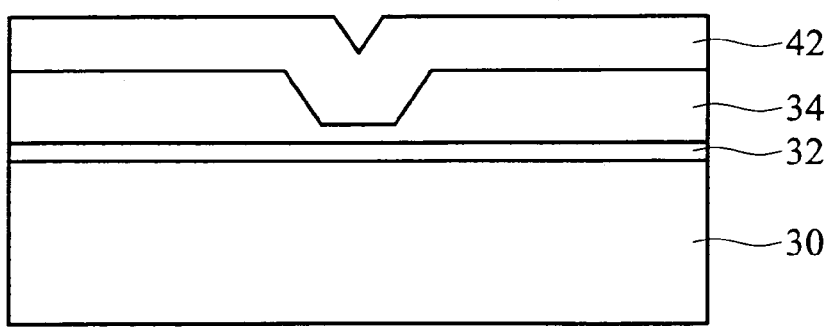

In FIG. 2C, after stripping off the photoresist layer 36, an oxide layer 42 is deposited on the first gate conductive layer 34 till filling the trench 40. The oxide layer 42 may be a silicon oxide layer formed by any well-known CVD process.

Figure 2D:
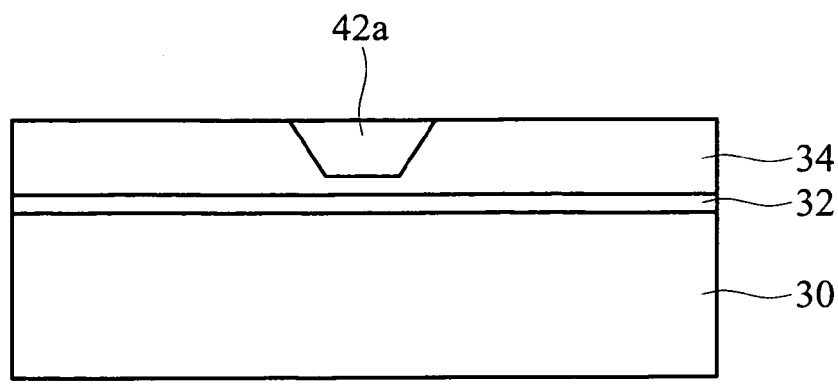

In FIG. 2D, the oxide layer 42 is subjected to a chemical-mechanical polishing (CMP) process whereby the first gate conductive layer 34 is planarized as well as some of the oxide layer 42 being remaining in the trench 40. The trench-filled oxide layer 42a will be used as a hard mask in a subsequent floating-gate etching process. It is noted that a silicon nitride deposition employed in the conventional floating gate process is omitted between the first gate conductive layer 34 and the oxide layer 42, and silicon nitride functioning as a polish stop is unnecessary at this CMP step. This can simplify process steps and save one etching process for removing silicon nitride.

Figure 2E:
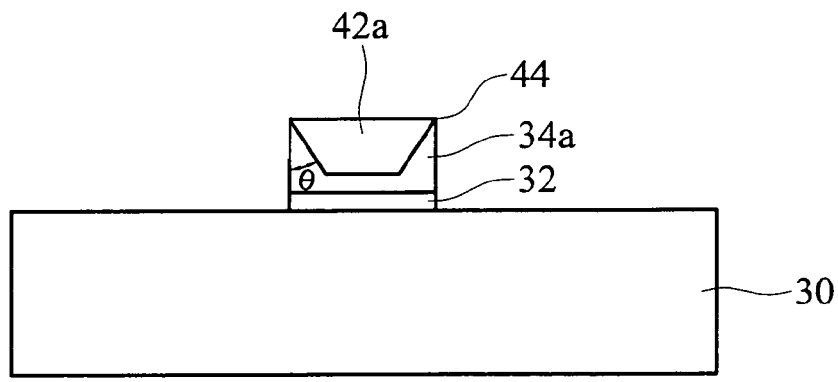

In FIG. 2E, using a floating-gate etching process with the trench-filled oxide layer 42a as a hard mask, the first gate conductive layer 34 is removed except for the portion 34a protected by the trench-filled oxide layer 42a, thus defining a floating gate 34a. Portions of the gate dielectric layer 32 not protected by the floating gate 34a will be further etched away. Compared with the conventional method using LOCOS polyoxide, the present invention uses the trench-filled oxide layer 42a over the first gate conductive layer 34 to pattern the floating gate 34a so that a corner edge 44 of the floating gate 34 exhibits a sharper and higher gate tip (e.g., poly tip). Preferably, the gate tip at the corner edge 44 has a angle ($\theta$) between about 0 degree to 90 degrees.

Figure 2F:
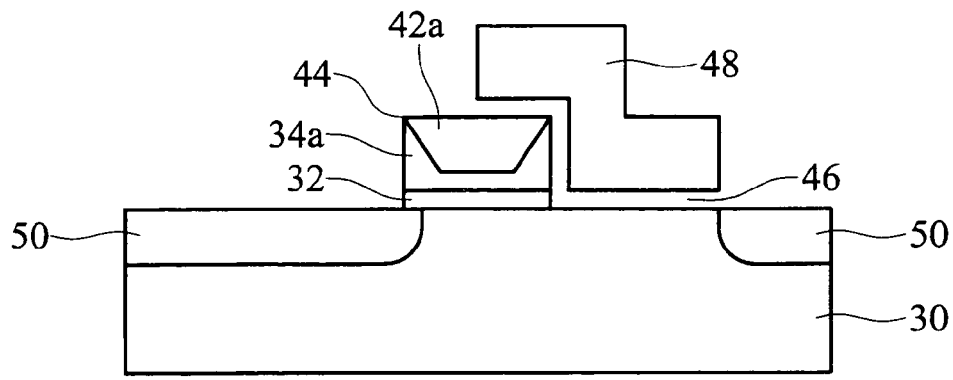

In FIG. 2F, an integrated dielectric layer 46 is formed over the semiconductor substrate 30, for example, an oxide layer, a nitride layer, an oxynitride layer or combinations thereof formed by any well-known CVD process or advanced deposition process. It is preferred that the integrated dielectric layer 46 has a thickness between about 100 to 500 Angstroms. A second gate conductive layer 48 is deposited over the integrated dielectric layer 46 and is then patterned over at least part of the floating gate 34a, thus functioning as a control gate 48. The second gate conductive layer 48 may be a polysilicon layer having a thickness between about 1000 to 3000 Angstroms deposited using CVD or low-pressure CVD (LPCVD) process. If desired the polysilicon layer can be ion implanted to the desired conductivity type. Additionally, although the control gate 48 is preferably a polysilicon electrode, the floating gate can be but not limited to a metal gate, a single crystalline silicon gate, or any combinations thereof if desired. The integrated dielectric layer 46 is also known as an interpoly dielectric layer, which separates the two polysilicon layers, namely, the floating gate 34a and the control gate 48. Doped regions 50, serving as a source region and a drain region, are formed in the semiconductor substrate 30 adjacent to the floating gate 34a and the control gate 48 respectively, and separated apart from each other.

Accordingly, a split-gate flash memory process has been presented that uses a trench etching process, an oxide deposition process and a floating-gate etching process to control the tip angle and uses an oxide CMP process to maintain the tip height, thus the corner edge 44 of the floating gate 34a can be formed as a tip with improved sharpness and improved height. Electrical field is easily concentrated in the poly tip, and the point is easily discharged, thus the erasure effect in the flash memory is increased. Moreover, since it is unnecessary to implement a silicon nitride deposition process into the split-gate flash memory process, one furnace cost is saved and process flow is simplified.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. In a flash memory process, forming a floating gate comprising: forming a gate dielectric layer overlying a semiconductor substrate; forming a first gate conductive layer overlying said gate dielectric layer; forming a photoresist layer overlying said first gate conductive layer, wherein said photoresist layer has a pattern opening corresponding to an area where a floating gate will be defined; removing at least part of said first gate conductive layer through said pattern opening to form a trench in said first gate conductive layer without exposing said gate dielectric layer; removing said photoresist layer; forming an oxide layer overlying said first gate conductive layer to fill said trench; partially removing said oxide layer till said oxide layer remaining in said trench is substantially leveled off with said first gate conductive layer, forming a trench-filled oxide layer; and removing portions of said first polysilicon layer not covered by said trench-filled oxide layer and leaving portions of the first polysilicon layer that are not covered by said trench filled oxide layer, and thereby said first gate conductive layer covered by said trench-filled oxide layer functioning as a floating gate with a tip.

2. The flash memory process of claim 1, wherein said floating gate a polysilicon gate with a polysilicon tip.

3. The flash memory process of claim 1, wherein said trench comprises a sidewall having a slope profile with an angle from vertical of greater than 0 degrees and less than 90 degrees.

4. The flash memory process of claim 1, wherein said oxide layer is formed using a CVD deposition process.

5. The flash memory process of claim 1, wherein said oxide layer remaining in said trench is substantially leveled off with said first gate conductive layer through a chemical mechanical polishing (CMP) process.

6. The flash memory process of claim 1, further comprising forming an integrated dielectric layer overlying said semiconductor substrate after the formation of said floating gate.

7. The flash memory process of claim 6, further comprising:
forming a second gate conductive layer overlying said integrated dielectric layer; and
patterning said second gate conductive layer as a control gate covering at least part of said floating gate.

8. The flash memory process of claim 6, wherein said integrated dielectric layer is selected from at least one of the group consisting of silicon oxide, silicon nitride, silicon oxynitride, and combinations thereof.

9. In a split-gate flash memory process, forming a floating gate comprising: forming a gate oxide layer overlying a semiconductor substrate; forming a first polysilicon layer overlying said gate oxide layer; forming a photoresist layer having a pattern opening overlying said first polysilicon layer, wherein said pattern opening corresponds to an area where a floating gate will be defined; dry etching said first polysilicon layer through said pattern opening to form a trench in said first polysilicon layer without exposing said gate oxide layer; removing said photoresist layer; depositing an oxide layer overlying said first polysilicon layer through a chemical vapor deposition (CVD) process to fill said trench; removing portions of said oxide layer to substantially planarized said oxide layer remaining in said trench as said first polysilicon layer through a chemical mechanical polishing (CMP) process; and dry etching said first polysilicon layer not covered by said oxide layer remaining in said trench and leaving portions of the first polysilicon layer that are not covered by said oxide layer, and thereby said first polysilicon layer covered by said oxide layer functioning as a floating gate, wherein the corner edge of said floating gate comprises a polysilicon tip.

10. The split-gate flash memory process of claim 9, wherein said trench comprises a sidewall having a slope profile with an angle from vertical of greater than 0 degrees and less than 90 degrees.

11. The split-gate flash memory process of claim 9, wherein said polysilicon tip has an angle being greater than 0 degree and less than 90 degrees.

12. The split-gate flash memory process of claim 9, further comprising forming an integrated dielectric layer overlying said semiconductor substrate after the formation of said floating gate.

13. The split-gate flash memory process of claim 11, further comprising:
forming a second polysilicon layer overlying said integrated dielectric layer; and
patterning said second polysilicon layer as a control gate covering at least part of said floating gate.

14. The split-gate flash memory process of claim 11, wherein said integrated dielectric layer is selected from at least one of the group consisting of silicon oxide, silicon nitride, silicon oxynitride, and combinations thereof.

* * * * *